(12) United States Patent
Yonemura et al.

(10) Patent No.: US 8,608,289 B2
(45) Date of Patent: Dec. 17, 2013

(54) LIQUID EJECTING HEAD, LIQUID EJECTING APPARATUS, AND PIEZOELECTRIC ELEMENT

(75) Inventors: Takayuki Yonemura, Suwa (JP); Kazuya Kitada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 239 days.

(21) Appl. No.: 13/046,655

(22) Filed: Mar. 11, 2011

(65) Prior Publication Data

US 2011/0221833 A1    Sep. 15, 2011

(30) Foreign Application Priority Data

Mar. 12, 2010 (JP) .................. 2010-056804
May 28, 2010 (JP) .................. 2010-122798

(51) Int. Cl.
  H01L 41/22 (2013.01)
  H04R 17/00 (2006.01)
  B41J 2/045 (2006.01)
  H01L 41/00 (2013.01)
  H02N 2/00 (2006.01)

(52) U.S. Cl.
  USPC ............................ 347/68; 310/311; 29/25.35

(58) Field of Classification Search
  None
  See application file for complete search history.

(56) References Cited

U.S. PATENT DOCUMENTS

| | | | |
|---|---|---|---|
| 5,350,721 A | 9/1994 | Abe et al. | |
| 5,453,262 A | 9/1995 | Dawson et al. | |
| 6,844,659 B2 | 1/2005 | Ikeda et al. | |
| 6,969,157 B2 | 11/2005 | Tomozawa et al. | |
| 7,498,725 B2 | 3/2009 | Iezumi et al. | |
| 7,589,450 B2 | 9/2009 | Takabe et al. | |
| 2005/0224851 A1 | 10/2005 | Nakazawa | |
| 2006/0170736 A1 | 8/2006 | Tomozawa et al. | |
| 2008/0265718 A1 | 10/2008 | Sakashita et al. | |
| 2008/0278038 A1 | 11/2008 | Kobayashi et al. | |
| 2008/0302658 A1 | 12/2008 | Sasaki et al. | |
| 2009/0230211 A1 | 9/2009 | Kobayashi et al. | |
| 2009/0243438 A1 | 10/2009 | Hamada et al. | |

(Continued)

FOREIGN PATENT DOCUMENTS

CN    1461703 A    12/2003
CN  101190846 A     6/2008

(Continued)

OTHER PUBLICATIONS

Effects of SrRuO3 buffer layer thickness on multiferroic (Bi0.9La0.10)(Fe0.95Mn0.05)O3) (J.Appl. Phys 106, 054115 (2009) ), Jiagang Wu and John Wang.*

(Continued)

*Primary Examiner* — Matthew Luu
*Assistant Examiner* — Erica Lin
(74) *Attorney, Agent, or Firm* — Kilpatrick Townsend & Stockton LLP

(57) ABSTRACT

A piezoelectric element includes a piezoelectric layer, and an electrode provided on the piezoelectric layer. The piezoelectric layer is composed of a compound oxide having a perovskite structure and containing bismuth lanthanum ferrate manganate and barium titanate. The molar ratio of the barium titanate to the total amount of the bismuth lanthanum ferrate manganate and the barium titanate is 0.09 or more and 0.29 or less. A liquid ejecting head includes a pressure-generating chamber communicating with a nozzle opening, and a piezoelectric element as described above. A liquid ejecting apparatus includes the above-described liquid ejecting head.

24 Claims, 16 Drawing Sheets

(56) References Cited

U.S. PATENT DOCUMENTS

| | | |
|---|---|---|
| 2009/0273651 A1 | 11/2009 | Kazama et al. |
| 2010/0214372 A1 | 8/2010 | Takabe |
| 2011/0102514 A1 | 5/2011 | Yonemura |
| 2011/0102517 A1 | 5/2011 | Yonemura et al. |
| 2011/0102518 A1* | 5/2011 | Yonemura et al. ............. 347/71 |
| 2011/0109704 A1 | 5/2011 | Furuya et al. |
| 2011/0164095 A1 | 7/2011 | Nawano et al. |
| 2011/0164096 A1 | 7/2011 | Nawano |
| 2011/0164097 A1 | 7/2011 | Nawano et al. |
| 2011/0164098 A1 | 7/2011 | Kobayashi et al. |
| 2011/0216135 A1* | 9/2011 | Yonemura ...................... 347/71 |

FOREIGN PATENT DOCUMENTS

| | | |
|---|---|---|
| EP | 1 741 557 A2 | 1/2007 |
| EP | 2 145 975 A2 | 1/2010 |
| JP | 2001-223404 A | 8/2001 |
| JP | 2007-287744 A | 11/2007 |
| JP | 2009-070926 A | 4/2009 |
| JP | 2009-071144 A | 4/2009 |
| JP | 2009-113419 A | 5/2009 |
| JP | 2009-231482 A | 10/2009 |
| JP | 2009-242229 A | 10/2009 |
| JP | 2009-252789 A | 10/2009 |
| JP | 2009-252790 A | 10/2009 |
| JP | 2010-016010 A | 1/2010 |
| JP | 2010-016011 A | 1/2010 |
| JP | 2010-067756 A | 3/2010 |
| JP | 2010-080733 A | 4/2010 |

OTHER PUBLICATIONS

The Extended European Search Report mailed on Jun. 20, 2011, in European Patent Application No. 11157439.8, for Seiko Epson Corporation.

Zhang, Shan-Tao, Preparation, structures, and multiferroic properties of single phase $Bi_{1-x}La_xFeO_3$ (x = 0-0.40) ceramics, J. Appl. Phys. 100, 114108 (2006), Paragraph 1.

Singh, S.K., Room temperature ferroelectric properties of Mn-substituted $BiFeO_3$ thin films deposited on Pt electrodes using chemical solution deposition, Appl. Phys. Lett. 88, 262908 (2006), Paragraphs 3-4.

Wu, Jiagang, and John Wang. "Effects of $SrRuO_3$ buffer layer thickness on mulitiferroic $(Bi_{0.90}La_{0.10})(Fe_{0.95}Mn_{0.05})O_3$ thin films." *Journal of Applied Physics* 106.5 (2009): 054115.

* cited by examiner

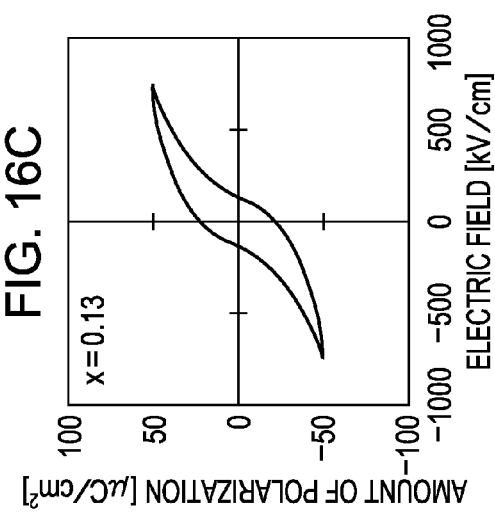
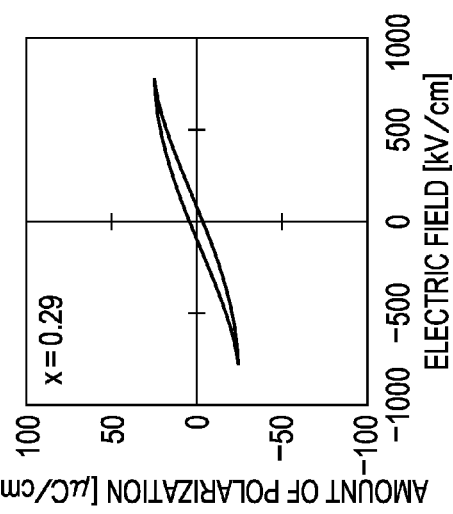
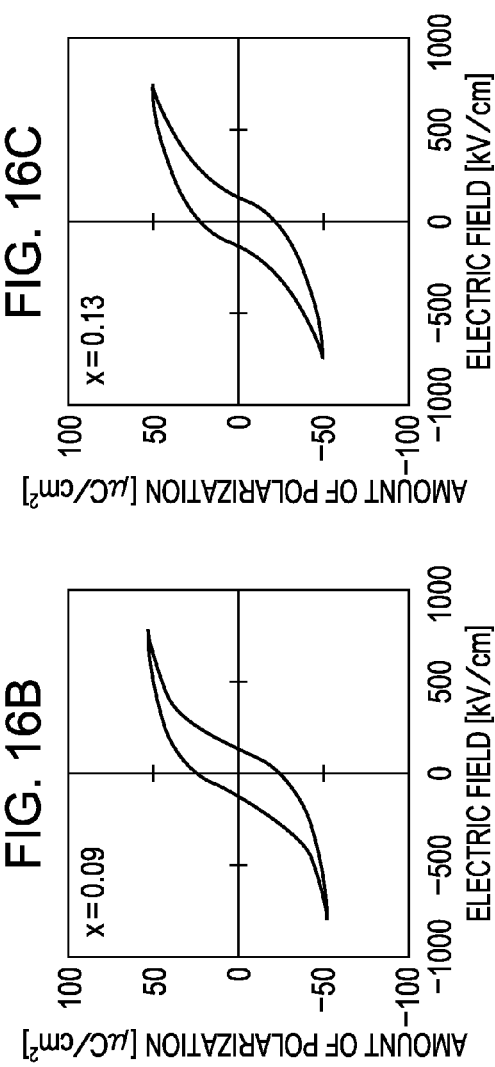
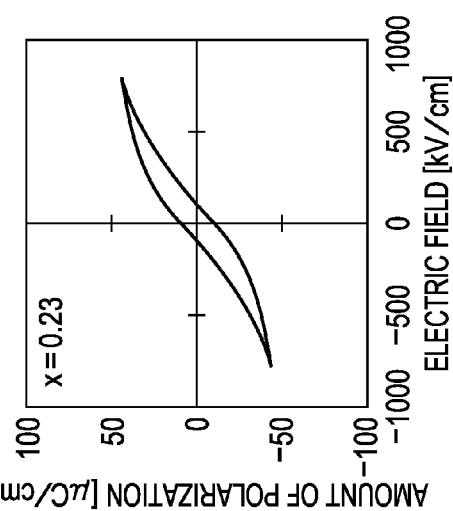
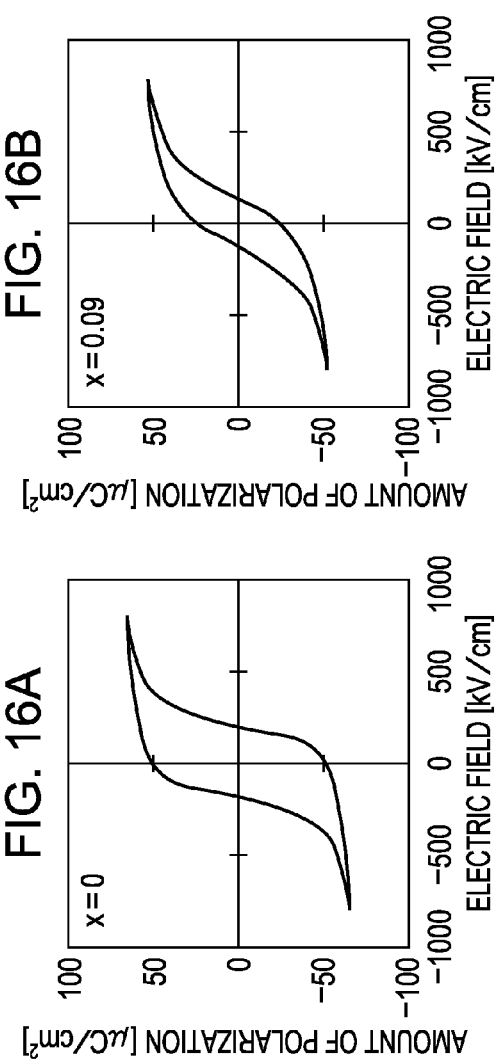
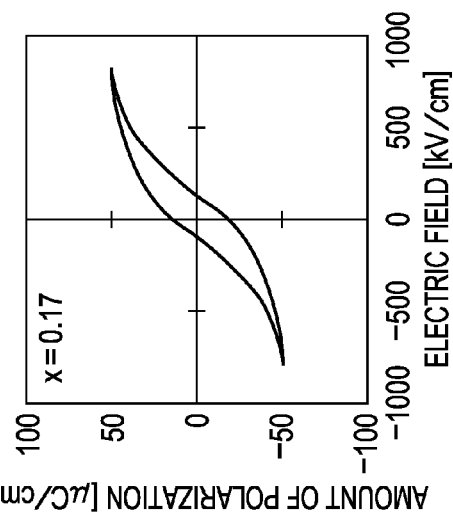

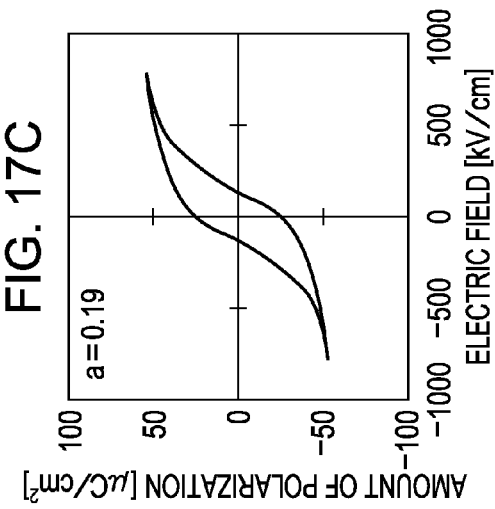
FIG. 17A  FIG. 17B  FIG. 17C
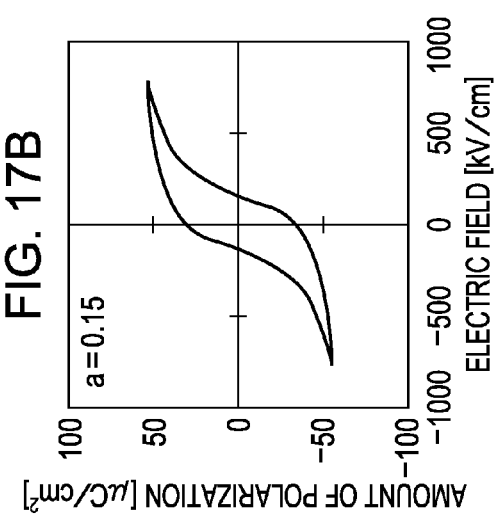
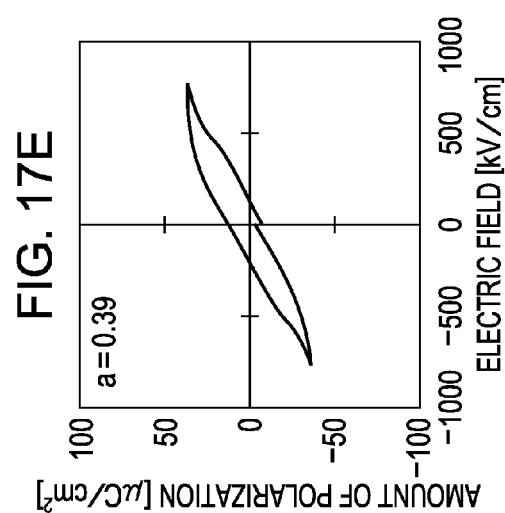
FIG. 17D
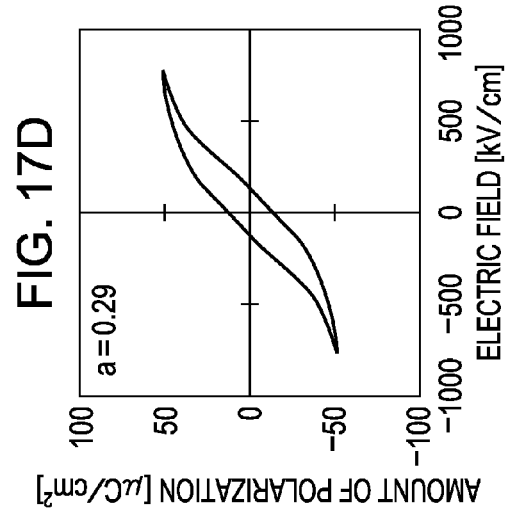
FIG. 17E

LIQUID EJECTING HEAD, LIQUID EJECTING APPARATUS, AND PIEZOELECTRIC ELEMENT

This application claims priority to Japanese Application No. 2010-056804, filed Mar. 12, 2010 and Japanese Application No. 2010-122798, filed May 28, 2010, both of which are incorporated by reference herein, in their entireties.

BACKGROUND

1. Technical Field

The present invention relates to a liquid ejecting head including a piezoelectric element, that causes a change in the pressure in a pressure-generating chamber that communicates with a nozzle opening, and that includes a piezoelectric layer and electrodes configured to apply a voltage to the piezoelectric layer. The invention also relates to a liquid ejecting apparatus including such a liquid ejecting head, and a piezoelectric element.

2. Related Art

A piezoelectric element generally includes a layer of piezoelectric material, for example, a crystallized dielectric material, sandwiched between two electrodes. Such a piezoelectric element is mounted on a liquid ejecting head as an actuator device. One example of a liquid ejecting head is an ink jet recording head, in which a pressure-generating chamber communicates with a nozzle opening that ejects ink droplets. The pressure-generating chamber includes a diaphragm, which is deformed using a piezoelectric element to apply pressure to ink in the pressure-generating chamber, thereby ejecting the ink as ink droplets from the nozzle opening.

A high piezoelectricity is required for piezoelectric materials in the piezoelectric layer. A typical example of a piezoelectric material is lead zirconate titanate (PZT), such as that disclosed in JP-A-2001-223404, the disclosure of which is hereby incorporated by reference.

However, due to environmental issues, piezoelectric materials having reduced amounts of lead are desirable. An example of a lead-free piezoelectric material is bismuth ferrite ($BiFeO_3$), which has a perovskite structure represented by $ABO_3$. However, such materials have low relative dielectric constants $\in_r$, and thus the amount of strain is lower than desired. This is a problem not only in ink jet recording heads, but also in other liquid ejecting heads that discharge liquids other than ink.

SUMMARY

An advantage of some aspects of the invention is to provide a liquid ejecting head including a piezoelectric material which has a high relative dielectric constant and in which the burden on the environment is reduced, a liquid ejecting apparatus including the liquid ejecting head, and a piezoelectric element including the piezoelectric material.

An exemplary liquid ejecting head includes a pressure-generating chamber communicating with a nozzle opening, and a piezoelectric element including a piezoelectric layer and an electrode provided on the piezoelectric layer. The piezoelectric layer is composed of a compound oxide having a perovskite structure and containing bismuth lanthanum ferrate manganate and barium titanate. The molar ratio of the barium titanate to the total amount of the bismuth lanthanum ferrate manganate and the barium titanate is between 0.09 and 0.29. The relative dielectric constant of the piezoelectric material is high. Furthermore, since the content of lead is reduced, the burden on the environment is reduced.

The molar ratio La/Bi of lanthanum to bismuth in the bismuth lanthanum ferrate manganate is preferably between 0.11 and 0.67. Accordingly, the relative dielectric constant of the piezoelectric layer is higher yet.

An exemplary liquid ejecting apparatus includes the above-described liquid ejecting head. The high relative dielectric constant of the piezoelectric layer provides a liquid ejecting apparatus with good ejection characteristics. In addition, the content of lead in the liquid ejecting apparatus is reduced, and thus the burden on the environment is reduced.

An exemplary piezoelectric element includes a piezoelectric layer, and an electrode provided on the piezoelectric layer. The piezoelectric layer is composed of a compound oxide having a perovskite structure and containing bismuth lanthanum ferrate manganate and barium titanate. The molar ratio of the barium titanate to the total amount of the bismuth lanthanum ferrate manganate and the barium titanate is between 0.09 and 0.29. The relative dielectric constant is high. Furthermore, since the content of lead is reduced, the burden on the environment is reduced.

BRIEF DESCRIPTION OF THE DRAWINGS

The invention will be described with reference to the accompanying drawings, wherein like numbers reference like elements.

FIGS. 16A to 16F are graphs showing P-E curves of Comparative Example 1 and Examples 1 to 5, respectively.

FIGS. 17A to 17E are graphs showing P-E curves of Example 1 (FIG. 17C) and Examples 6 to 9 (FIGS. 17A, 17B, 17D, and 17E, respectively).

DESCRIPTION OF EXEMPLARY EMBODIMENTS

Figure 1:
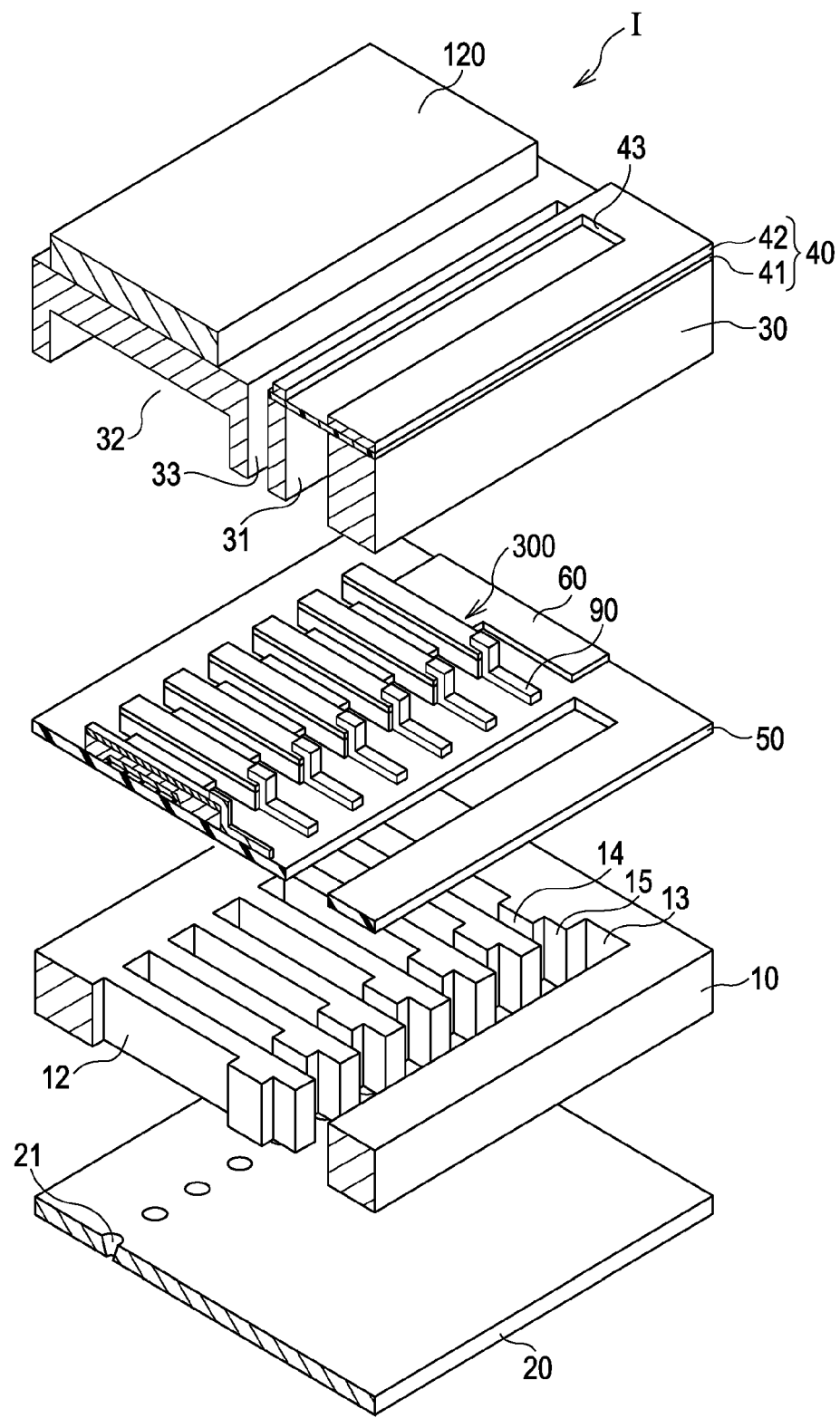
FIG. 1 is an exploded perspective view of a recording head according to a first embodiment.
Figure 2:
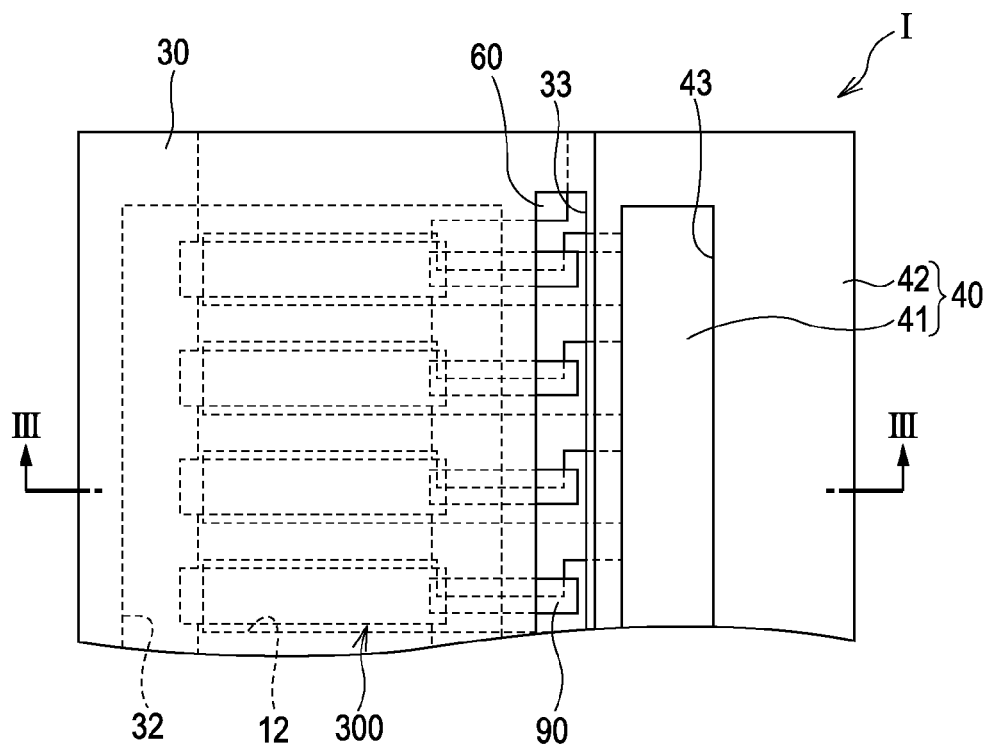
FIG. 2 is a plan view of the recording head according to the first embodiment.
Figure 3:
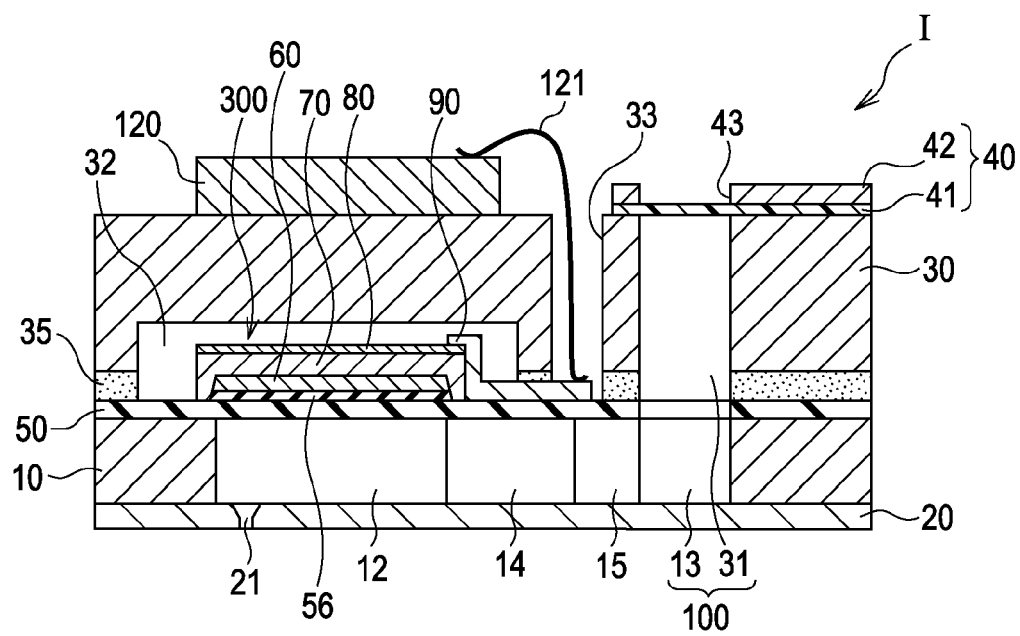
FIG. 3 is a cross-sectional view of the recording head according to the first embodiment, taken along line III-III in FIG. 2.

FIG. 1 is an exploded perspective view of a recording head according to a first embodiment. FIG. 2 is a plan view of the recording head of FIG. 1, and FIG. 3 is a cross-sectional view of the recording head according to the first embodiment, taken along line III-III in FIG. 2. Shown in FIGS. 1 to 3, an inkjet recording head includes a channel substrate 10 such as a single-crystal silicon substrate, and an elastic film 50, which may be composed of silicon dioxide, provided on one surface of the channel substrate 10.

A plurality of pressure-generating chambers 12 are provided along the width direction of the channel substrate 10. A communication section 13 is provided alongside the pressure-generating chambers 12. The communication section 13 communicates with each of the pressure-generating chambers 12 through a respective ink supply channel 14 and a respective communicating channel 15, one of each of which is provided to each pressure-generating chamber 12. The communication section 13 communicates with a reservoir section 31 of a protective substrate (described below) and forms a part of an ink reservoir common to all the pressure-generating chambers 12. The ink supply channels 14 are narrower than the pressure-generating chambers 12, so that they provide constant resistance to the ink being routed from the communication section 13 to the pressure-generating chambers 12. In the illustrated embodiment, the ink supply channel 14 is narrower than the channel 15 at only one side. Alternatively, the ink supply channel 14 may be narrower than the channel 15 at both sides, and/or may be narrowed in the vertical direction. In the above-described embodiment, the channel substrate 10 includes a liquid channel composed of the pressure-generating chambers 12, the communication section 13, the ink supply channels 14, and the communicating channels 15.

A nozzle plate 20 is attached to the surface of the channel substrate 10 opposite the elastic film 50, such as with an adhesive, a heat-adhesive film, or the like. The nozzle plate 20 includes nozzle openings 21, each of which communicates with an end of a corresponding one of the pressure-generating chambers 12 (the end opposite the ink supply channel 14). The nozzle plate 20 is composed of, for example, a glass-ceramic material, a single-crystal silicon substrate, or stainless steel.

The elastic film 50 is provided on a side of the channel substrate 10 opposite the nozzle plate 20, as described above. An adhesion layer 56 (see FIG. 3) may be provided for improving the adhesiveness between a first electrode 60 and the elastic film 50. The adhesion layer 56 may be composed of, for example, titanium oxide and have a thickness of, for example, about 30 to 50 nm. An insulating film composed of, for example, zirconium oxide may be provided on the elastic film 50 if needed.

Furthermore, the first electrode 60, a piezoelectric layer 70 which is a thin film having a thickness, for example, of 2 μm or less, such as between 0.1 to 0.3 μm, and a second electrode 80, are stacked on the adhesion layer 56 to form a piezoelectric element 300. Herein, the term "piezoelectric element" 300 refers to the combination of the first electrode 60, the piezoelectric layer 70, and the second electrode 80. In general, the piezoelectric element 300 is constituted by forming one of the electrodes of the piezoelectric element 300 as a common electrode, and patterning the other electrode and the piezoelectric layer 70 for each of the pressure-generating chambers 12. In the illustrated embodiment, the first electrode 60 is the common electrode, and the second electrode 80 is individual to each pressure-generating chamber 12. However, these electrodes may be reversed on the grounds of a driving circuit or wiring. Furthermore, herein, a combination of the piezoelectric element 300 and a diaphragm in which a displacement is generated by the driving of the piezoelectric element 300 is referred to as an "actuator device." In the example described above, the elastic film 50, the adhesion layer 56, the first electrode 60, and the insulating film function as the diaphragm. However, the structure is not limited thereto. For example, the elastic film 50 and the adhesion layer 56 may not be provided. Further, the piezoelectric element 300 itself may also substantially function as the diaphragm.

In some embodiments, the piezoelectric material constituting the piezoelectric layer 70 is a compound oxide having the perovskite structure and containing bismuth lanthanum ferrate manganate and barium titanate. In an A-site of the perovskite structure, i.e., the $ABO_3$ structure, oxygen is 12-coordinated, and in a B-site thereof, oxygen is 6-coordinated to form an octahedron. Bismuth (Bi), lanthanum (La), and barium (Ba) are located in the A-site, and iron (Fe), manganese (Mn), and titanium (Ti) are located in the B-site. Specifically, the compound oxide is a solid solution in which bismuth lanthanum ferrate manganate and barium titanate are uniformly solid-soluted.

Furthermore, the molar ratio of the barium titanate to the total amount of the bismuth lanthanum ferrate manganate and the barium titanate may be between 0.09 and 0.29. In the bismuth lanthanum ferrate manganate, the molar ratio of lanthanum to bismuth may be between 0.11 and 0.67.

The compound oxide may have a composition ratio substantially represented by, for example, formula (1) below. However, formula (1) is a composition notation based on the stoichiometry, and an inevitable shift of the composition due to a lattice mismatch, oxygen deficiency, or the like is permitted.

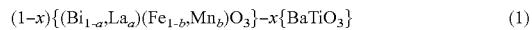

$$(1-x)\{(Bi_{1-a},La_a)(Fe_{1-b},Mn_b)O_3\}-x\{BaTiO_3\} \quad (1)$$

(0.09≤x≤0.29, 0.10≤a≤0.39, 0.01≤b≤0.09)

In this exemplary piezoelectric material, as described in the Examples below, the relative dielectric constant is higher than in materials without barium titanate, that is, purely $BiFeO_3$-based piezoelectric materials.

Figure 4:
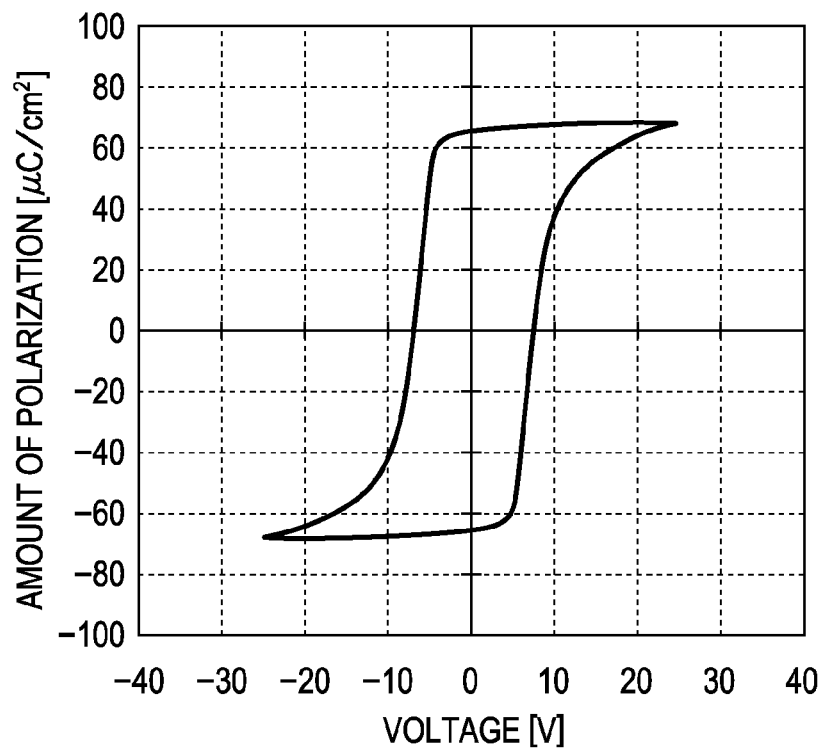
FIG. 4 is a graph showing a P-V curve of sample 2.
Figure 5:
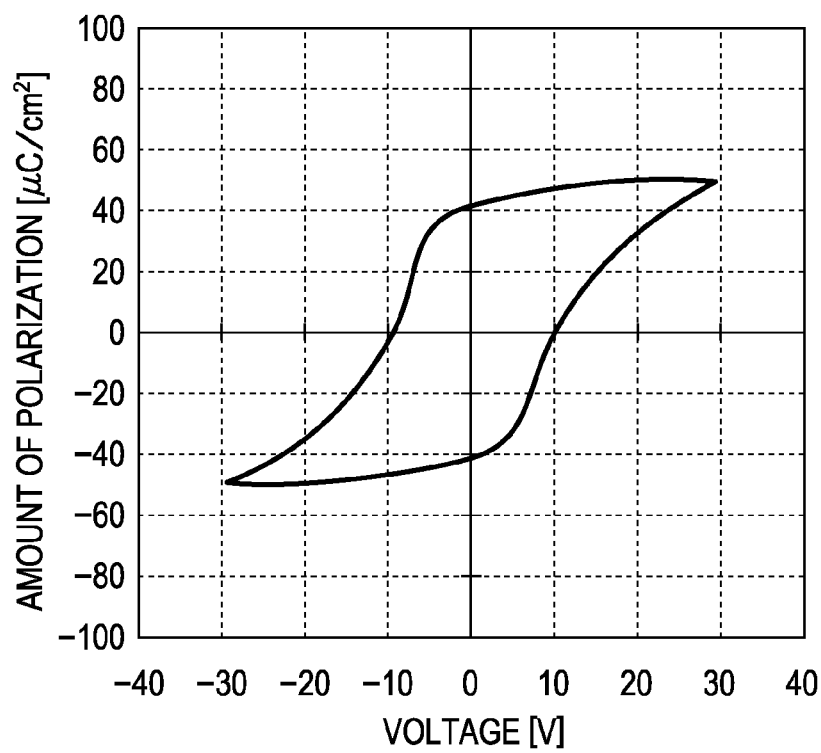
FIG. 5 is a graph showing a P-V curve of sample 11.
Figure 6:
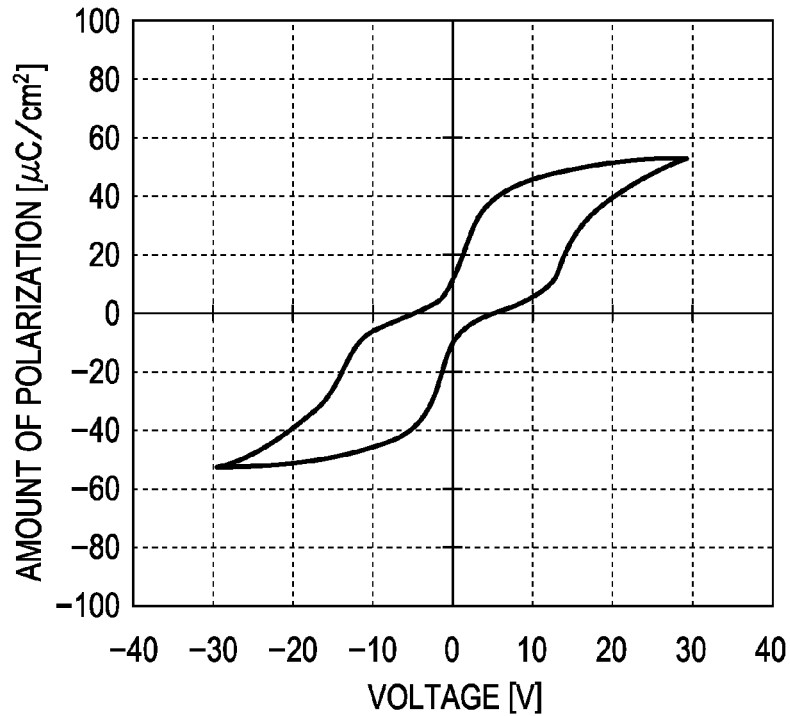
FIG. 6 is a graph showing a P-V curve of sample 14.
Figure 7:
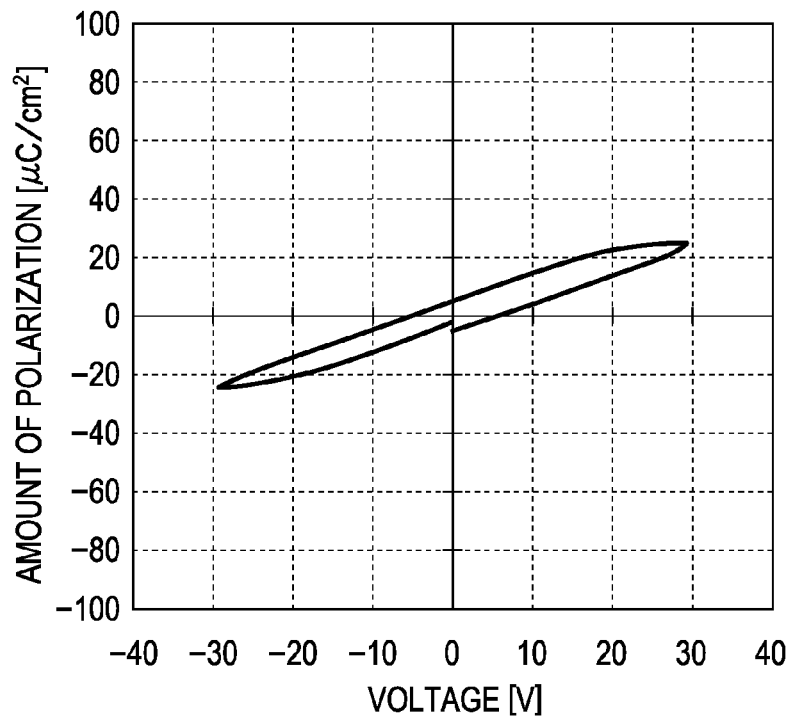
FIG. 7 is a graph showing a P-V curve of sample 15.

Here, bismuth lanthanum ferrate manganate having the perovskite structure will be described in detail. Bismuth lanthanum ferrate manganate having the perovskite structure is a compound oxide containing Bi, La, Fe, and Mn, in which Bi and La are located in the A-site and Fe and Mn are located in the B-site, as described above. In addition, bismuth lanthanum ferrate manganate preferably has a composition ratio substantially represented by formula (2) below. Note that compound oxides having the perovskite structure and containing Bi, La, Fe, and Mn showed different characteristics: some had those of a ferroelectric material; others, those of an antiferroelectric material; and others, those of a paraelectric material depending on the composition ratio of the compound oxide. Piezoelectric elements (samples 1 to 18) were prepared in which the composition ratio of formula (2) was varied, and the relationship between the amount of polarization (P) and the voltage (V) was determined by applying a triangular wave of 25 V or 30 V. As examples of the results, the result of sample 2 is shown in FIG. 4, the result of sample 11 is shown in FIG. 5, the result of sample 14 is shown in FIG. 6, and the result of sample 15 is shown in FIG. 7. The compositions are shown in Table 1. In samples 16 to 18, the leak was too large to perform the measurement. Thus, samples 16 to 18 could not be used as piezoelectric materials.

$$(Bi_{1-m},La_m)(Fe_{1-n},Mn_n)O_3 \quad (2)$$

(0.10≤m≤0.38, 0.01≤n≤0.09)

As shown in FIGS. 4 and 5, in each of samples 2 and 11, a hysteresis loop, which is characteristic to a ferroelectric material, was observed. A similar hysteresis was observed in each of sample 1 and samples 3 to 10. On the other hand, in sample 14, a double hysteresis having two hysteresis loop shapes in a positive electric field direction and a negative electric field direction, which is characteristic to an antiferroelectric material was observed as shown in FIG. 6. In samples 12 and 13, a similar double hysteresis was observed. Sample 15 was a paraelectric material, as shown in FIG. 7.

Figure 8:
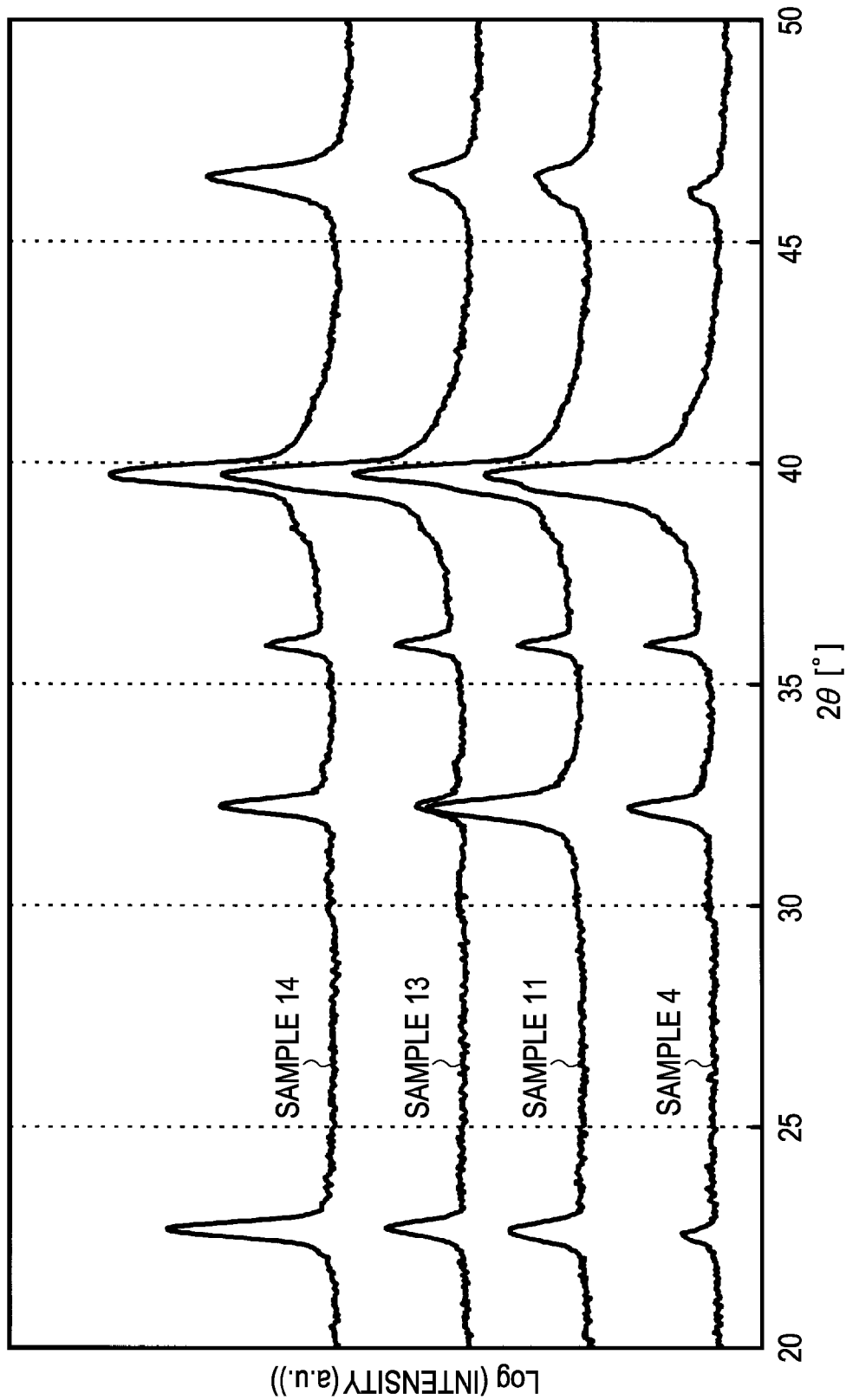
FIG. 8 is a graph showing X-ray diffraction patterns.
Figure 9:
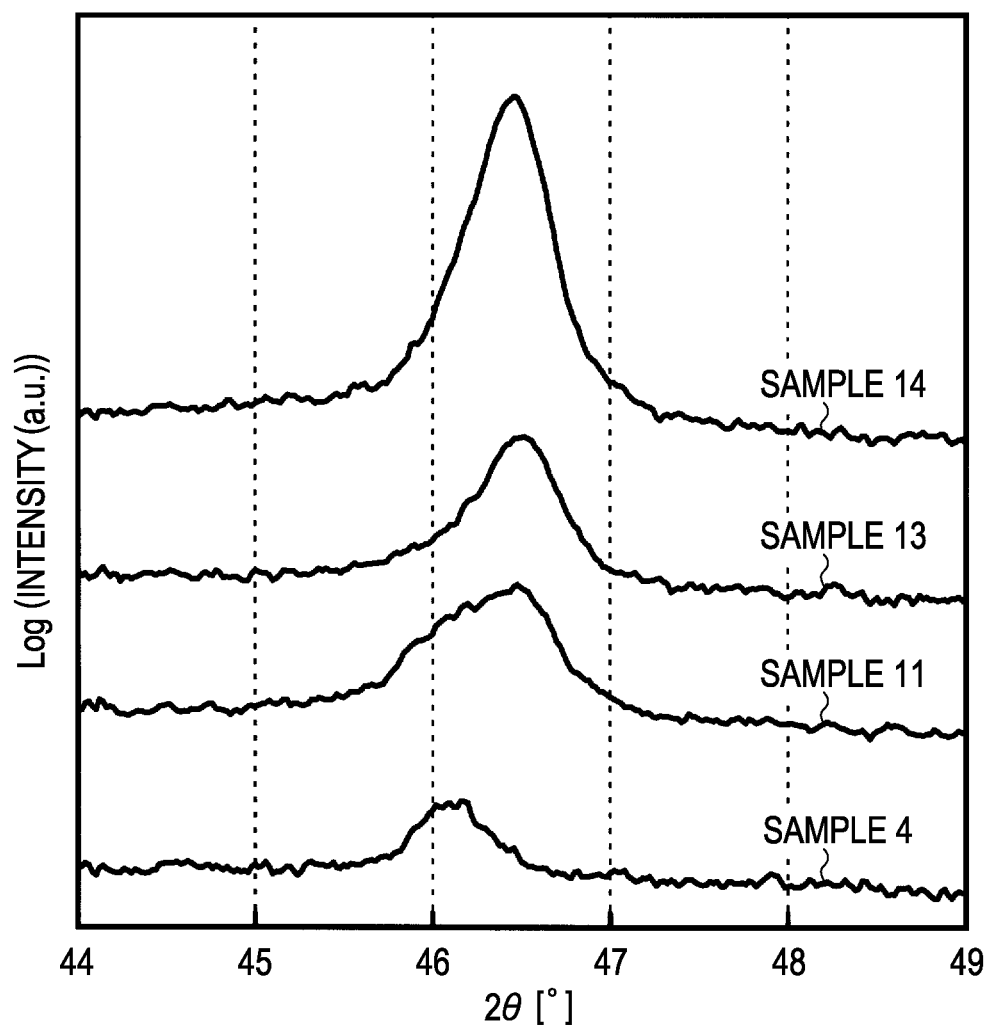
FIG. 9 is an enlarged graph of a relevant portion of FIG. 8.

As shown in the X-ray diffraction patterns (FIGS. 8 and 9), which show the correlation between the diffraction intensity and the diffraction angle 2θ, when powder X-ray diffraction was measured, a diffraction peak attributable to a phase exhibiting ferroelectricity (ferroelectric phase) was observed in sample 4, and a diffraction peak attributable to a phase exhibiting antiferroelectricity (antiferroelectric phase) was observed in sample 14. In sample 11, both the peaks were observed. According to these results, it became clear that sample 11 is in a phase boundary between the ferroelectric phase and the antiferroelectric phase (morphotropic phase boundary (M.P.B.)). FIG. 9 is an enlarged graph of FIG. 8.

TABLE 1

|  | m | n | Phase |
|---|---|---|---|
| Sample 1 | 0.10 | 0.03 | Ferroelectric |
| Sample 2 | 0.10 | 0.05 | Ferroelectric |
| Sample 3 | 0.10 | 0.09 | Ferroelectric |
| Sample 4 | 0.14 | 0.05 | Ferroelectric |
| Sample 5 | 0.17 | 0.03 | Ferroelectric |
| Sample 6 | 0.18 | 0.03 | Ferroelectric |
| Sample 7 | 0.20 | 0.01 | Ferroelectric |
| Sample 8 | 0.20 | 0.02 | Ferroelectric |
| Sample 9 | 0.19 | 0.03 | Ferroelectric |
| Sample 10 | 0.19 | 0.04 | Ferroelectric |
| Sample 11 | 0.19 | 0.05 | Ferroelectric |
| Sample 12 | 0.21 | 0.03 | Antiferroelectric |
| Sample 13 | 0.24 | 0.05 | Antiferroelectric |
| Sample 14 | 0.29 | 0.05 | Antiferroelectric |
| Sample 15 | 0.48 | 0.05 | Paraelectric |
| Sample 16 | 0.20 | 0.00 | — |
| Sample 17 | 0.10 | 0.00 | — |
| Sample 18 | 0.00 | 0.00 | — |

A lead electrode 90 extends from an end of the ink supply channel 14 side onto the elastic film 50 or the insulating film 56, and is connected to each second electrode 80. The lead electrodes 90 may be made, for example, of gold.

A protective substrate 30, in which the reservoir section 31 is provided, is bonded on the channel substrate 10 above the first electrode 60, and on the elastic film 50 or the insulating film 56, and on the lead electrode 90, with an adhesive 35. In the illustrated embodiment, this reservoir section 31 penetrates vertically through the protective substrate 30 and extends along the width direction of the pressure-generating chambers 12. As described above, the reservoir section 31 communicates with the communication section 13 of the channel substrate 10 to form the ink reservoir 100. Alternatively, the communication section 13 may be divided into a plurality of sections for each of the pressure-generating chambers 12, so that only the reservoir section 31 constitutes the reservoir. Furthermore, the ink supply channels 14 may be provided exterior to the channel substrate 10, such as in the elastic film 50, the insulating film 56, etc.

In addition, the protective substrate 30 has a piezoelectric element cavity 32 that provides a space in which the movement of the piezoelectric elements 300 is not substantially disturbed. The cavity may or may not be sealed.

The protective substrate 30 is preferably composed of a material having a coefficient of thermal expansion substantially the same as that of the channel substrate 10, for example, glass, a ceramic material, or the like. For example, the protective substrate 30 and the channel substrate 10 may be formed of a single-crystal silicon substrate.

Furthermore, a through-hole 33 is provided, which penetrates through the protective substrate 30 in the thickness direction. The end of each lead electrode 90, extending from each of the piezoelectric elements 300, is exposed in the through-hole 33.

A driving circuit 120, for driving the parallel piezoelectric elements 300, is fixed on the protective substrate 30. For example, a circuit substrate or a semiconductor integrated circuit (IC) can be used as the driving circuit 120. The driving circuit 120 is electrically connected to the lead electrode 90 with a connecting wire 121 therebetween. The connecting wire 121 is an electrically conductive wire, such as a bonding wire.

Furthermore, a compliance substrate 40 including a sealing film 41 and a fixing plate 42 is bonded on the protective substrate 30. The sealing film 41 is composed of a material with high flexibility and low rigidity. This sealing film 41 seals one surface of the reservoir section 31. The fixing plate 42 is composed of a relatively hard material. The portion of the fixing plate 42 adjacent the reservoir 100 defines an opening 43. Accordingly, the surface of the reservoir 100 is sealed by only the flexible sealing film 41.

In an ink jet recording head I of this embodiment, ink is introduced from an ink inlet connected to an external ink supply unit (not shown), and the space from the reservoir 100 to the nozzle openings 21 is filled with the ink. Subsequently, a voltage is applied between the first electrode 60 and the second electrode 80 of each of the pressure-generating chambers 12 in accordance with a recording signal from the driving circuit 120 so that the elastic film 50, the adhesion layer 56, the first electrode 60, and the piezoelectric layer 70 are subjected to flexural deformation. As a result, the pressure in the pressure-generating chambers 12 increases to eject ink droplets from the nozzle openings 21.

Next, an example of a method for producing the ink jet recording head of this embodiment will be described with reference to FIGS. 10A to 14B. FIGS. 10A to 14B are each a cross-sectional view of a pressure-generating chamber in the longitudinal direction.

Figure 10A:
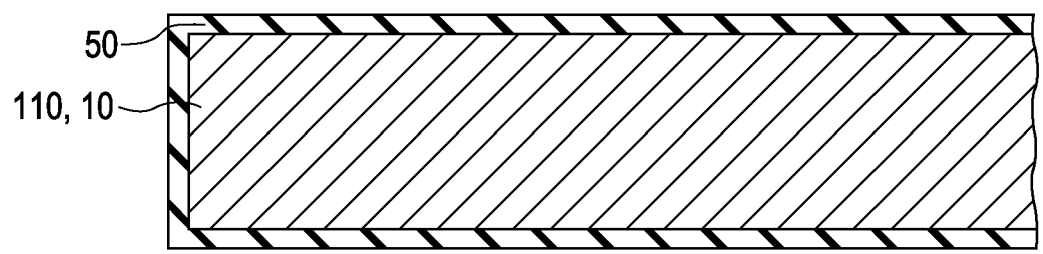
FIGS. 10A-10B, 11A-11C, 12A-12B, 13A-13C, and 14A-14B are cross-sectional views showing steps of an exemplary method of producing the recording head according to the first embodiment.
Figure 10B:
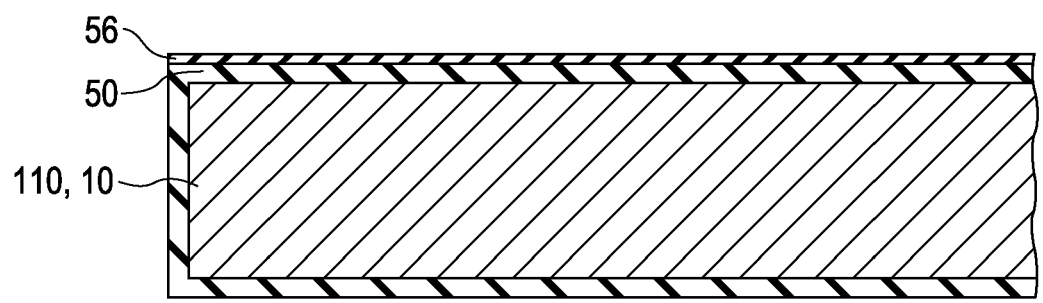

First, as shown in FIG. 10A, a silicon dioxide film ($SiO_2$) constituting an elastic film 50 and the like is formed on a surface of a silicon wafer 110 for a channel substrate, by thermal oxidation or the like. Next, as shown in FIG. 10B, an adhesion layer 56 composed of, for example, titanium oxide, is formed on the elastic film 50 by a reactive sputtering method, thermal oxidation, or the like.

Figure 11A:
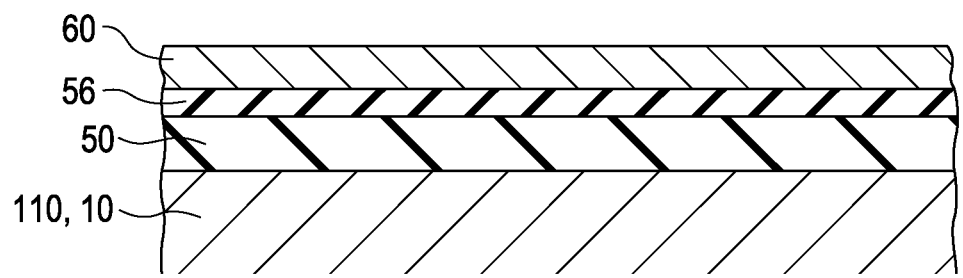

Next, as shown in FIG. 11A, a first electrode 60 composed of, for example, platinum, iridium, iridium oxide, or a stacked structure thereof, is formed over the entire surface of the adhesion layer 56, by a sputtering method or the like.

Next, a piezoelectric layer 70 is stacked on the first electrode 60. The piezoelectric layer 70 can be formed in a variety of ways. For example, the piezoelectric layer 70 can be formed by using a metal-organic decomposition (MOD) method in which a piezoelectric layer 70 composed of a metal oxide is obtained by applying a solution prepared by dissolving or dispersing an organometallic compound in a solvent, drying the solution, and baking at a high temperature, or a chemical solution method such as a sol-gel method. Other non-limiting liquid-phase methods and solid-phase methods, such as a laser ablation method, a sputtering method, a pulse laser deposition (PLD) method, a chemical vapor deposition (CVD) method, or an aerosol deposition method may also be employed.

Figure 11B:
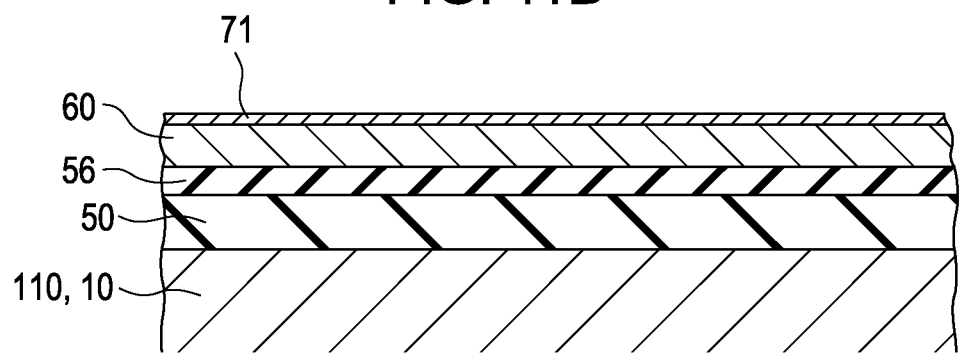

One specific, non-limiting example of a procedure for forming the piezoelectric layer 70 will be described. First, as shown in FIG. 11B, a sol or an MOD solution (precursor solution) is applied onto the first electrode 60 by a spin-coating method or the like to form a piezoelectric precursor film 71 (coating step). The solution may contain organometallic compounds, which may contain bismuth (Bi), iron (Fe), lanthanum (La), manganese (Mn), titanium (Ti), and/or barium (Ba) in any desired composition ratio The precursor solution may be prepared by mixing organometallic compounds containing Bi, Fe, La, Mn, Ti, and/or Ba in any desired molar ratio, and dissolving or dispersing the resulting mixture in an organic solvent such as an alcohol. Examples of organometallic compounds that can be used include metal alkoxides, organic acid salts, and β-diketone complexes. An example of an organometallic compound containing Bi is bismuth 2-ethylhexanoate. An example of an organometallic compound containing Fe is iron 2-ethylhexanoate. An example of an organometallic compound containing La is lanthanum 2-ethylhexanoate. An example of an organometallic compound containing Mn is manganese 2-ethylhexanoate. Examples of organometallic compounds containing Ti include titanium isopropoxide, titanium 2-ethylhexanoate, and titanium (di-1-propoxide)bis(acetylacetonate). Examples of organometallic compounds containing Ba include barium isopropoxide, barium 2-ethylhexanoate, and barium acetylacetonate. These compounds are specified for exemplary purposes only and should not be construed as being limiting.

Next, this piezoelectric precursor film 71 is heated to a certain temperature, and dried for a certain period of time (drying step). Next, the dried piezoelectric precursor film 71 is degreased by heating to a certain temperature for a certain period of time (degreasing step). Herein, the term "degreasing" means that organic components (for example, $NO_2$, $CO_2$, and $H_2O$) contained in the piezoelectric precursor film 71 are removed. The drying step and the degreasing step may be performed in any suitable atmosphere, for example in air or an inert gas.

Figure 11C:
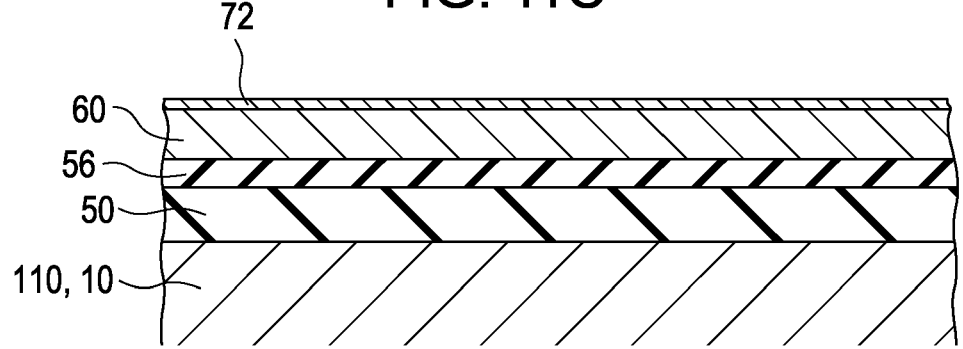

Next, as shown in FIG. 11C, the piezoelectric precursor film 71 is crystallized by heating to a certain temperature, for example, about 600° C. to 700° C., for a certain period of time, to form a piezoelectric film 72 (baking step). The baking step may be performed in any suitable atmosphere, for example air or an inert gas.

Exemplary heating devices which may be used in the drying step, the degreasing step, and the baking step, include a rapid thermal annealing (RTA) device with which radiative heating is performed by an infrared lamp, and a hot plate.

Figure 12A:
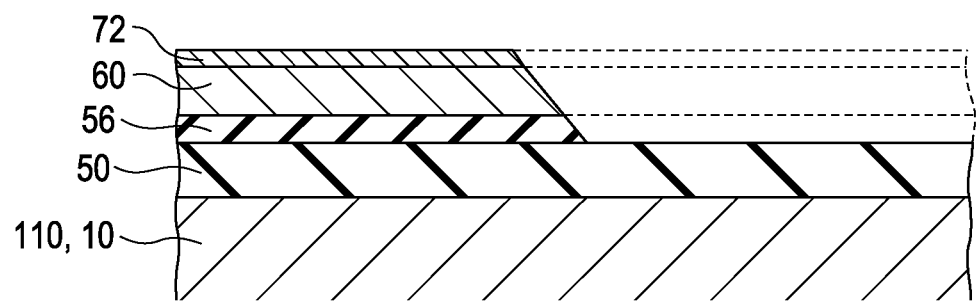

Next, a resist (not shown) having a predetermined shape is formed on the piezoelectric film 72. As shown in FIG. 12A, in some embodiments, the first electrode 60 and a first layer of the piezoelectric film 72 are pattered at the same time using the resist as a mask so that side faces of the first electrode 60 and the first layer of the piezoelectric film 72 are slanted.

Figure 12B:
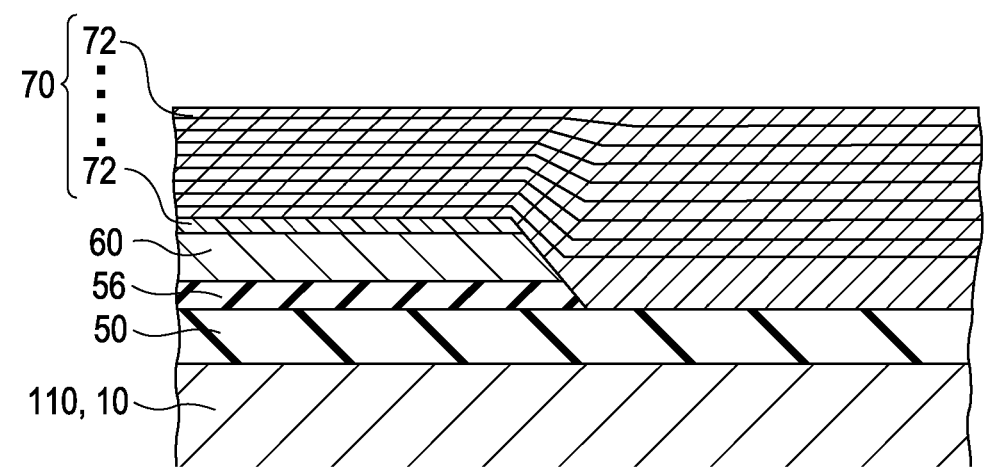

Next, after the resist is removed, the above-described coating step, drying step, degreasing step, and optionally the baking step are repeated a plurality of times in accordance with the desired thickness and other characteristics, to form a piezoelectric layer 70 including a plurality of piezoelectric films 72. Thus, as shown in FIG. 12B, a piezoelectric layer 70 including a plurality of piezoelectric films 72 and having any desired thickness is formed. For example, when the film thickness of a coating solution per application is about 0.1 μm, for example, the thickness of the whole piezoelectric layer 70 including ten piezoelectric films 72 is about 1.1 μm. In the illustrated embodiment, several piezoelectric films 72 are stacked. Alternatively, only a single piezoelectric film 72 may be provided.

Figure 13A:
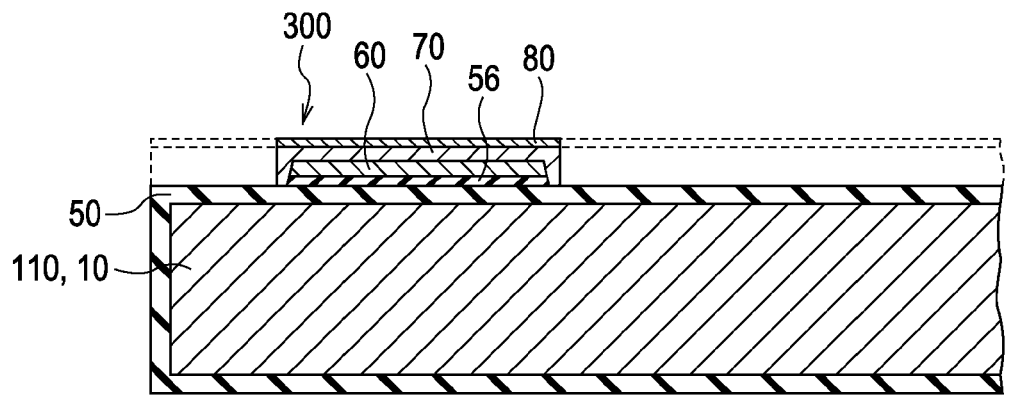

After the piezoelectric layer 70 is formed, as shown in FIG. 13A, a second electrode 80 composed of, for example, platinum is provided on the piezoelectric layer 70, such as by sputtering or the like. The piezoelectric layer 70 and the second electrode 80 are provided in an area facing each pressure-generating chamber 12, thereby defining a piezoelectric element 300 including the first electrode 60, the piezoelectric layer 70, and the second electrode 80. Note that the patterning of the piezoelectric layer 70 and the second electrode 80 can be performed at one time by dry etching through a resist (not shown) with a specific shape. Post-annealing may then be performed, such as in a temperature range of 600° C. to 700° C., as needed. As a result, satisfactory interfaces can be provided between the piezoelectric layer 70 and the first electrode 60 and between the piezoelectric layer 70 and the second electrode 80, and in addition, crystallinity of the piezoelectric layer 70 can be improved.

Figure 13B:
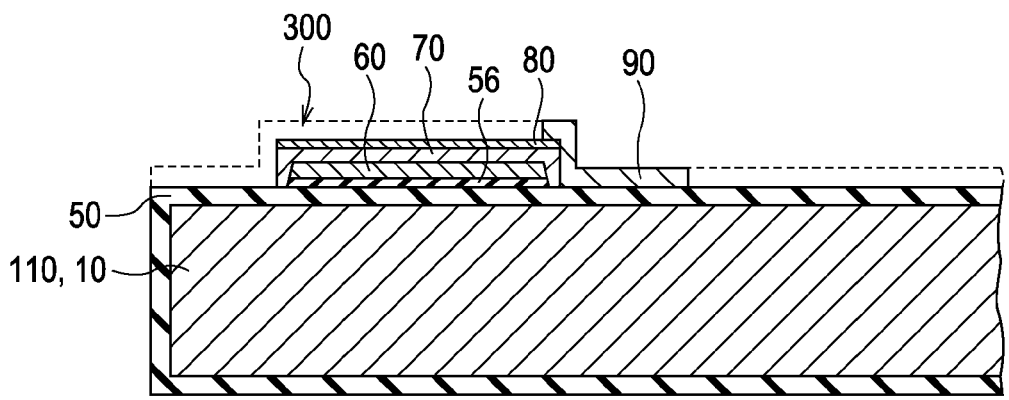

Next, as shown in FIG. 13B, a lead electrode 90 composed of, for example, gold (Au) is formed over the entire surface of the wafer 110, and patterning is then performed for each piezoelectric element 300 through a mask pattern (not shown) composed of a resist or the like.

Figure 13C:
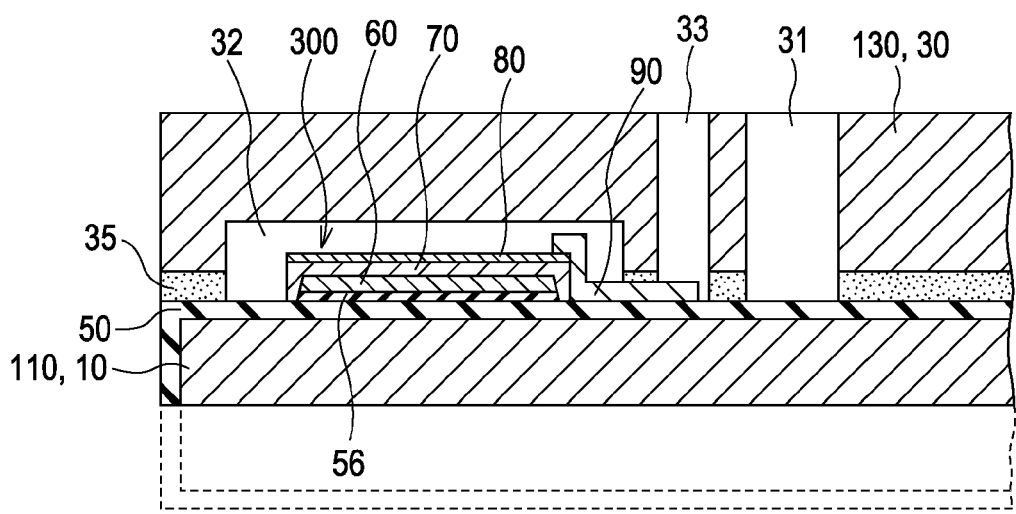

Next, as shown in FIG. 13C, a wafer 130 for a protective substrate is bonded to the surface of the wafer 110 that has the piezoelectric elements 300 thereon, with an adhesive 35. The wafer 130 is a silicon wafer divided into a plurality of protective substrates 30. Subsequently, the thickness of the wafer 110 is reduced to a certain value.

Figure 14A:
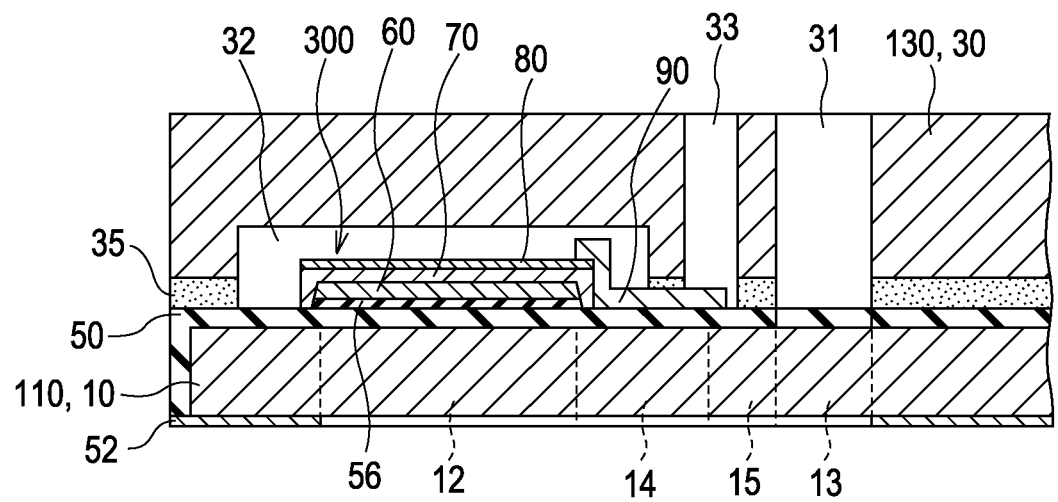

Next, as shown in FIG. 14A, a mask film 52 is provided on the wafer 110, and is patterned so as to have a specific shape.

Figure 14B:
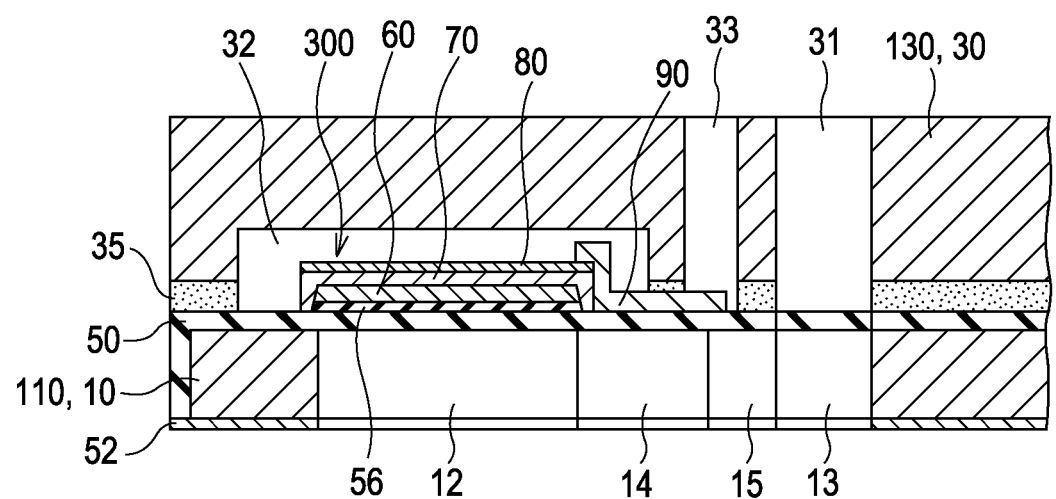

Next, as shown in FIG. 14B, anisotropic etching (wet etching) of the wafer 110 is performed using an alkaline solution such as a potassium hydroxide (KOH) solution through the mask film 52, thereby forming the pressure-generating chambers 12, the communication sections 13, the ink supply channels 14, the communicating channels 15, etc.

Next, unnecessary portions of the outer peripheries of the wafers 110 and 130 are removed by, for example, cutting by dicing or the like. The mask film 52 is removed from the wafer 110. The nozzle plate 20 is then bonded to this surface, and the compliance substrate 40 is bonded to the wafer 130. The wafer 110 and other components are then divided into a channel substrate 10 etc. having the size of one chip, as shown in FIG. 1. Thus, an exemplary ink jet recording head I is produced.

EXAMPLES

The invention will now be described more specifically by way of Examples. It should be noted that the invention is not limited to the Examples below.

Example 1

First, a silicon dioxide film having a thickness of 400 nm was formed on a surface of a silicon substrate oriented in the (100) direction by thermal oxidation. Next, a titanium film having a thickness of 40 nm was formed on the silicon dioxide film by an RF sputtering method. The titanium film was thermally oxidized to form a titanium oxide film. Next, a platinum film having a thickness of 150 nm was formed on the titanium oxide film in two stages of ion sputtering and a vapor deposition method, thus forming a first electrode oriented in the (111) direction.

Subsequently, a piezoelectric layer was formed on the first electrode by a spin coating method, as follows: First, xylene and octane solutions of bismuth 2-ethylhexanoate, lanthanum 2-ethylhexanoate, iron 2-ethylhexanoate, manganese 2-ethylhexanoate, barium 2-ethylhexanoate, and titanium 2-ethylhexanoate were mixed in a certain ratio to prepare a precursor solution. This precursor solution was dropped on the substrate having the titanium oxide film and the first electrode thereon, and the substrate was rotated at 1,500 rpm to form a piezoelectric precursor film (coating step). Next, drying and degreasing were conducted at 350° C. for three minutes (drying and degreasing steps). These coating step and drying and degreasing steps were repeated three times, and baking was then conducted at 650° C. for three minutes by rapid thermal annealing (RTA). This step in which the coating step and the drying and degreasing steps were repeated three times and the baking step was then conducted once was repeated three times. Thus, a piezoelectric layer having a total thickness of 345 nm was formed by performing the coating a total of nine times.

Subsequently, a platinum film having a thickness of 100 nm was formed as a second electrode 80 on the piezoelectric layer 70 by a DC sputtering method, and baking was then conducted at 650° C. for five minutes using RTA, thus forming a piezoelectric element 300 including the piezoelectric layer 70 composed of a compound oxide having the perovskite structure represented by general formula (1) provided above in which x was 0.09, a was 0.19, and b was 0.03. As a reminder, formula I is reproduced here:

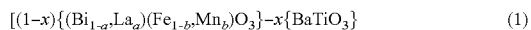

$$[(1-x)\{(Bi_{1-a}, La_a)(Fe_{1-b}, Mn_b)O_3\} - x\{BaTiO_3\}] \quad (1)$$

Examples 2 to 9

Piezoelectric elements 300 were formed as in Example 1 except that the mixing ratio of the xylene and octane solutions of bismuth 2-ethylhexanoate, lanthanum 2-ethylhexanoate, iron 2-ethylhexanoate, manganese 2-ethylhexanoate, barium 2-ethylhexanoate, and titanium 2-ethylhexanoate was changed, and compound oxides used as the piezoelectric layer 70 were represented by general formula (1) above in which x, a, and b were those shown in Table 2.

Comparative Example 1

A piezoelectric elements 300 was formed as in Example 1 except that barium 2-ethylhexanoate and titanium 2-ethylhexanoate were not included in the precursor solution, and a compound oxide represented by general formula (1) above in which x, a, and b were those shown in Table 2 was used as the piezoelectric layer 70.

TABLE 2

|  | x | a | b |
|---|---|---|---|
| Example 1 | 0.09 | 0.19 | 0.03 |
| Example 2 | 0.13 | 0.19 | 0.03 |
| Example 3 | 0.17 | 0.19 | 0.03 |
| Example 4 | 0.23 | 0.19 | 0.03 |
| Example 5 | 0.29 | 0.19 | 0.03 |
| Example 6 | 0.09 | 0.10 | 0.03 |
| Example 7 | 0.09 | 0.15 | 0.03 |
| Example 8 | 0.09 | 0.29 | 0.03 |
| Example 9 | 0.09 | 0.39 | 0.03 |
| Comparative Example 1 | 0 | 0.19 | 0.03 |

Test Example 1

Figure 15:
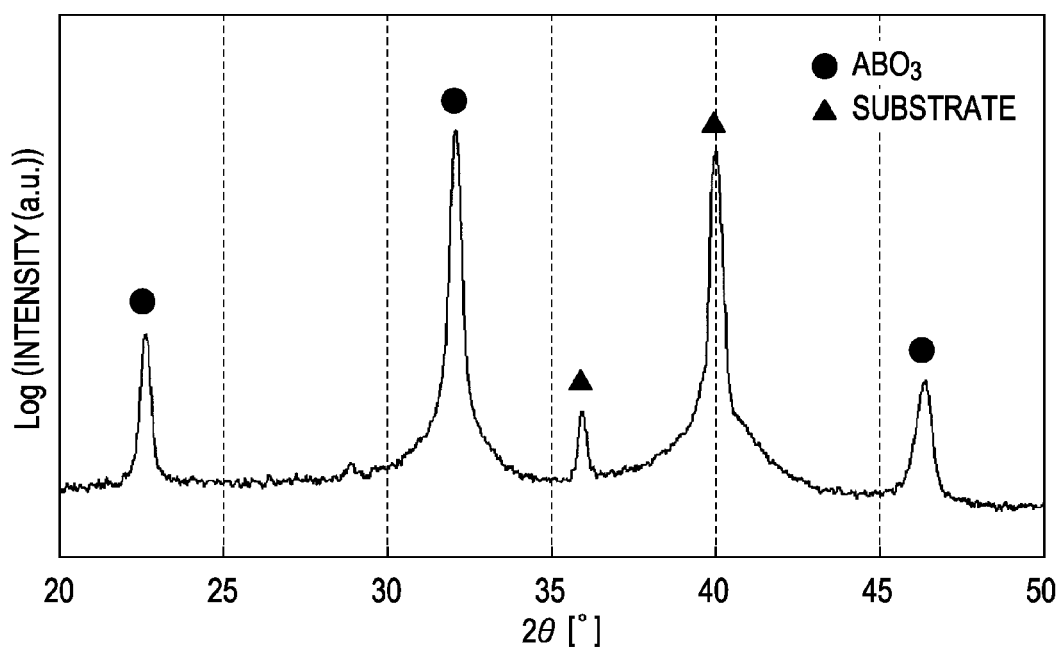
FIG. 15 is a graph showing an X-ray diffraction pattern of Example 1.

For each of the piezoelectric elements of Examples 1 to 9 and Comparative Example 1, a powder X-ray diffraction pattern of the piezoelectric layer was determined at room temperature with a D8 Discover X-ray diffractometer manufactured by Bruker AXS using CuKα-rays as an X-ray source. As a result, only peaks attributable to the $ABO_3$ structure and peaks attributable to the substrate were observed in all Examples 1 to 9 and Comparative Example 1, and no other peaks attributable to a heterogeneous phase was observed. As an example of the results, an X-ray diffraction pattern showing the correlation between the diffraction intensity and the diffraction angle 2θ of Example 1 is shown in FIG. 15.

Test Example 2

For each of the piezoelectric elements of Examples 1 to 9 and Comparative Example 1, the relationship between the amount of polarization and the electric field (P-E curve) at an applied electric field of 800 kVcm$^{-1}$ was determined by applying a triangular wave with a frequency of 1 kHz at room temperature with an FCE-1A ferroelectric characteristic evaluation system manufactured by TOYO Corporation using an electrode pattern having a diameter φ of 400 μm. The result of Comparative Example 1 is shown in FIG. 16A, the result of Example 1 is shown in FIG. 16B, the result of Example 2 is shown in FIG. 16C, the result of Example 3 is shown in FIG. 16D, the result of Example 4 is shown in FIG. 16E, and the result of Example 5 is shown in FIG. 16F. The result of Example 6 is shown in FIG. 17A, the result of Example 7 is shown in FIG. 17B, the result of Example 8 is shown in FIG. 17D, the result of Example 9 is shown in FIG. 17E, and the result of Example 1 is also shown in FIG. 17C.

According to the results, as shown in FIGS. 16A to 17E, Examples 1 to 9 and Comparative Example 1 were ferroelectric materials. More specifically, as shown in FIGS. 16A to 16F, when a was 0.19, in Comparative Example 1, the amount of polarization $P_r$ was 52 μCcm$^{-2}$, whereas in each of Examples 2 to 5, the amount of polarization $P_r$ was in the range of 27 to 50 μCcm$^{-2}$, which was smaller than that of Comparative Example 1. In addition, with an increase in x, the amount of polarization $P_r$ tended to decrease. When x was 0.29, a P-E loop close to that of a paraelectric material was obtained. According to these results, it became clear that the characteristics of a ferroelectric material were exhibited at least in the range of 0≤x≤0.29. Furthermore, as shown in FIGS. 17A to 17E, when x was 0.09, with an increase in a, the amount of polarization $P_r$ tended to decrease. When a was 0.39, the amount of polarization $P_r$ decreased and a P-E loop close to that of a paraelectric material was obtained. According to these results, it became clear that the characteristics of a ferroelectric material were exhibited at least in the range of 0≤a≤0.39.

Test Example 3

Figure 18:
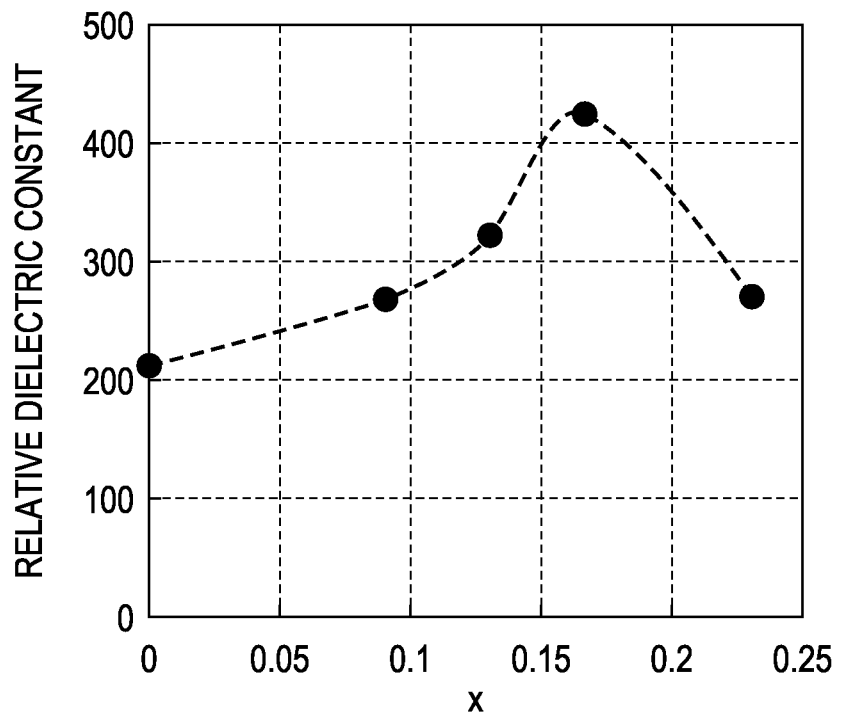
FIG. 18 is a relative dielectric constant-composition plot of Examples 1 to 4 and Comparative Example 1.
Figure 19:
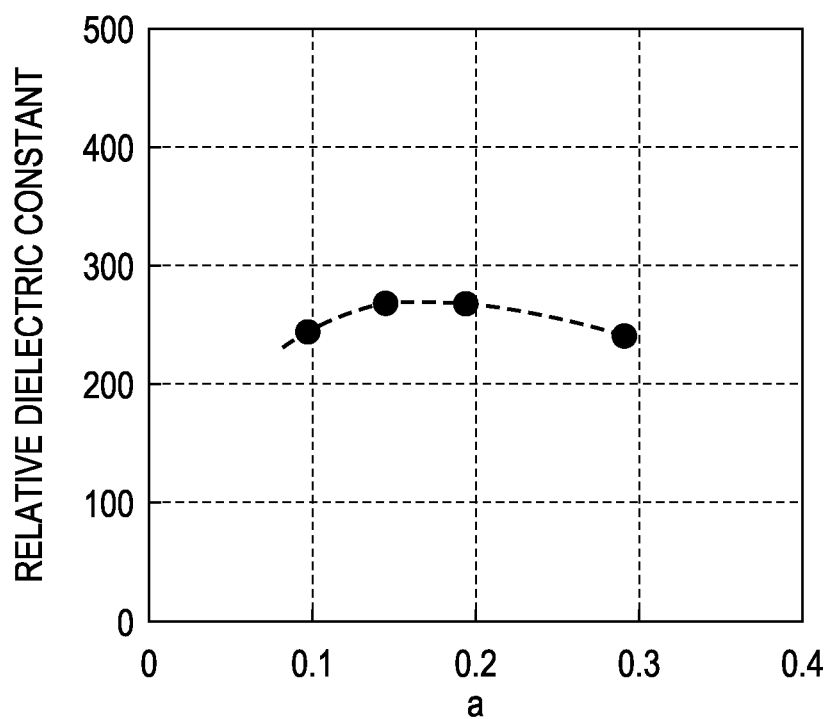
FIG. 19 is a relative dielectric constant-composition plot of Example 1 and Examples 6 to 8.

For each of the piezoelectric elements of Examples 1 to 9 and Comparative Example 1, the relative dielectric constant of the piezoelectric layer was measured with a 4294A impedance analyzer manufactured by Hewlett-Packard Development Company at room temperature (25° C.) at a frequency of 1 kHz using an electrode pattern having a diameter φ of 500 μm. The results of Examples 1 to 4 and Comparative Example 1 are shown in FIG. 18. The results of Example 1 and Examples 6 to 8 are shown in FIG. 19.

According to the results, as shown in FIG. 18, when x was in the range of 0.05≤x≤0.23, the piezoelectric layer showed a relative dielectric constant larger than that of Comparative Example 1. In addition, it was found that the maximum of the relative dielectric constant was present near x=0.17. Similarly, as shown in FIG. 19, relative dielectric constants larger than that of Comparative Example 1 were shown in the range of $0.10 \leq a \leq 0.29$.

Other Embodiments

Embodiments of the invention have been described, but the basic configuration of the invention is not limited to the configuration described above. For example, in the embodiments described above, a single-crystal silicon substrate was used as the channel substrate 10. However, the channel substrate 10 is not particularly limited to this. Alternatively, for example, a silicon-on-insulator (SOI) substrate, or another material such as glass may also be used.

Furthermore, the piezoelectric element 300 is not limited to the embodiments described above. For example, the invention can also be applied to a longitudinal vibration piezoelectric element in which a piezoelectric material and an electrode-forming material are alternately stacked and the resulting stacked structure is expanded and contracted in the axial direction.

Figure 20:
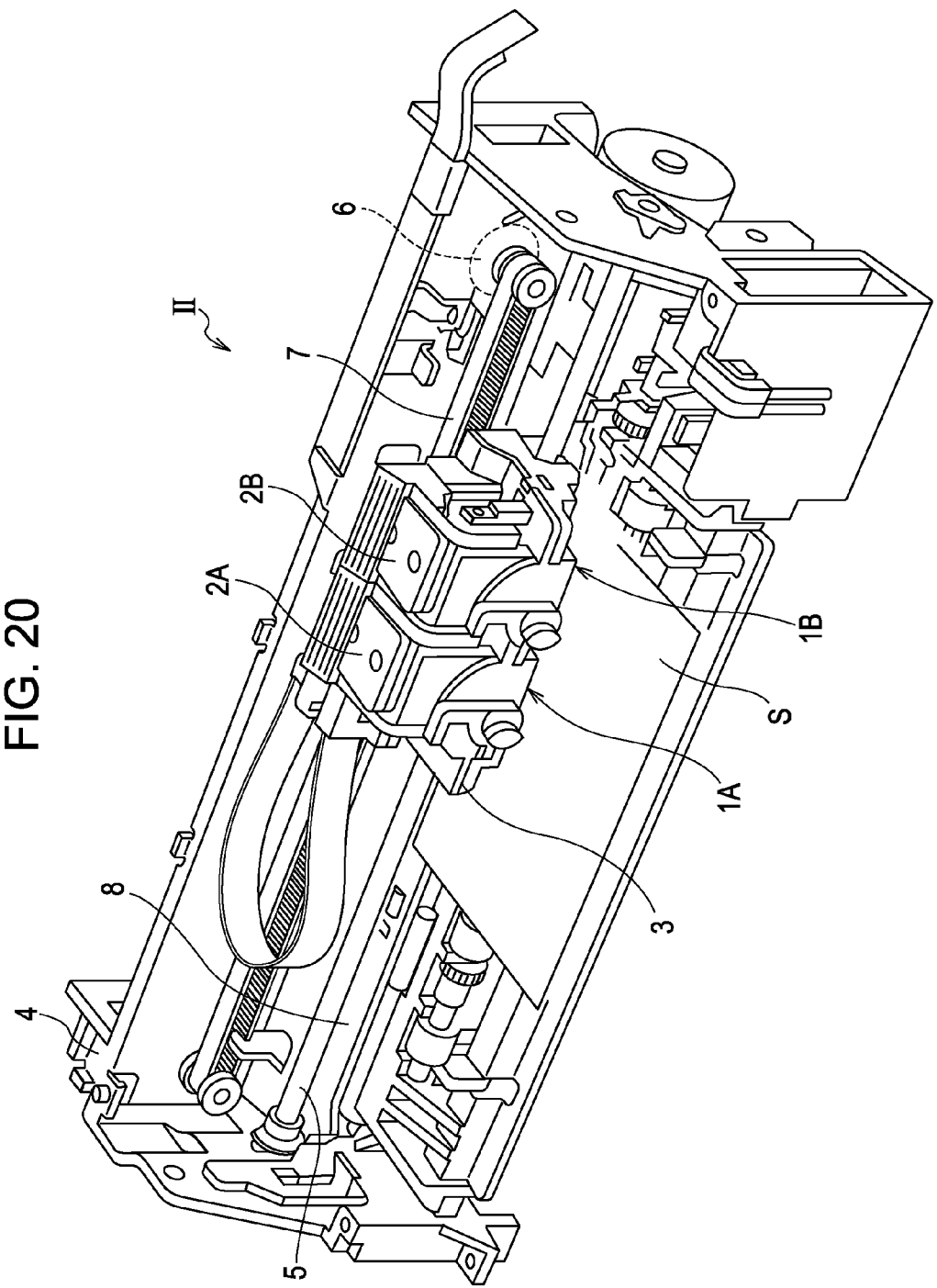
FIG. 20 is a perspective view of a recording apparatus according to an embodiment of the invention.

Furthermore, the ink jet recording head of these embodiments constitutes a part of a recording head unit including an ink channel communicating with an ink cartridge and the like, and is mounted on an ink jet recording apparatus. FIG. 20 is a schematic view showing an example of such an ink jet recording apparatus.

An ink jet recording apparatus II shown in FIG. 20 includes recording head units 1A and 1B each including the ink jet recording head I. Ink cartridges 2A and 2B are detachably provided in the recording head units 1A and 1B, respectively. A carriage 3 mounts the recording head units 1A and 1B and is provided on a carriage shaft 5 attached to a main body 4 of the apparatus so as to move in a direction of the shaft. The recording head units 1A and 1B eject, for example, black ink and colored ink, respectively.

When a driving force of a driving motor 6 is transmitted to the carriage 3 through gears (not shown) and a timing belt 7, the carriage 3 moves along the carriage shaft 5. A platen 8 is provided along the carriage shaft 5 in the main body 4. A recording sheet S, such as paper, used as a recording medium and fed by a paper-feeding roller (not shown) or the like is transported while being put around the platen 8.

In the embodiments described above, an ink jet recording head has been described as an example of a liquid ejecting head. However, the invention can be used in liquid ejecting heads that eject liquids other than ink. Examples of the other liquid ejecting heads include recording heads used in image-recording apparatuses such as printers, coloring-material-ejecting heads used in producing color filters of liquid crystal displays or the like, electrode-material-ejecting heads used for forming electrodes of organic electroluminescent (EL) displays, field emission displays (FEDs), or the like, and living-organic-matter-ejecting heads used for producing biochips.

Furthermore, the invention is not limited to liquid ejecting heads. The invention can also be applied to piezoelectric elements mounted on other devices such as ultrasonic devices, e.g., ultrasonic generators; ultrasonic motors; pressure sensors; or pyroelectric elements such as infrared (IR) sensors. Furthermore, the invention can also be similarly applied to ferroelectric elements such as ferroelectric memory.

What is claimed is:

1. A liquid ejecting head comprising:
   a pressure-generating chamber in fluid communication with a nozzle; and
   a piezoelectric element disposed adjacent the pressure-generating chamber and configured to ejected fluid through the nozzle, the piezoelectric element comprising a piezoelectric layer and an electrode disposed on the piezoelectric layer,
   wherein the piezoelectric layer comprises a compound oxide having a perovskite structure and comprising bismuth lanthanum ferrate manganate and barium titanate, and wherein a molar ratio of the barium titanate to the total amount of the bismuth lanthanum ferrate manganate and the barium titanate is 0.09 or more and 0.29 or less.

2. The liquid ejecting head according to claim 1, wherein a molar ratio of lanthanum to bismuth in the bismuth lanthanum ferrate manganate is 0.11 or more and 0.67 or less.

3. The liquid ejecting head according to claim 1, wherein the compound oxide has a composition ratio represented by $$(1-x)\{(Bi_{1-a},La_a)(Fe_{1-b},Mn_b)O_3\}-x\{BaTiO_3\},$$

wherein $0.09 \leq x \leq 0.29$, $0.10 \leq a \leq 0.39$, and $0.01 \leq b \leq 0.09$.

4. The liquid ejecting head according to claim 3, wherein $x \approx 0.17$.

5. The liquid ejecting head according to claim 3, wherein $0.10 \leq a \leq 0.29$.

6. The liquid ejecting head according to claim 1, wherein the bismuth lanthanum ferrate manganate has a composition ratio represented by $$(Bi_{1-m},La_m)(Fe_{1-n},Mn_n)O_3,$$

wherein $0.10 \leq m \leq 0.38$, and $0.01 \leq n \leq 0.09$.

7. A liquid ejecting apparatus comprising the liquid ejecting head according to claim 1.

8. The liquid ejecting apparatus according to claim 7, wherein a molar ratio of lanthanum to bismuth in the bismuth lanthanum ferrate manganate is 0.11 or more and 0.67 or less.

9. The liquid ejecting apparatus according to claim 7, wherein the compound oxide has a composition ratio represented by $$(1-x)\{(Bi_{1-a},La_a)(Fe_{1-b},Mn_b)O_3\}-x\{BaTiO_3\},$$

wherein $0.09 \leq x \leq 0.29$, $0.10 \leq a \leq 0.39$, and $0.01 \leq b \leq 0.09$.

10. The liquid ejecting apparatus according to claim 9, wherein $x \approx 0.17$.

11. The liquid ejecting apparatus according to claim 9, wherein $0.10 \leq a \leq 0.29$.

12. The liquid ejecting apparatus according to claim 7, wherein the bismuth lanthanum ferrate manganate has a composition ratio represented by $$(Bi_{1-m},La_m)(Fe_{1-n},Mn_n)O_3,$$

wherein $0.10 \leq m \leq 0.38$, and $0.01 \leq n \leq 0.09$.

13. A piezoelectric element comprising:
   a piezoelectric layer, and an electrode disposed on the piezoelectric layer;
   wherein the piezoelectric layer comprises a compound oxide having a perovskite structure and comprising bismuth lanthanum ferrate manganate and barium titanate, and wherein a molar ratio of the barium titanate to the total amount of the bismuth lanthanum ferrate manganate and the barium titanate is 0.09 or more and 0.29 or less.

14. The piezoelectric element according to claim 13, wherein a molar ratio of lanthanum to bismuth in the bismuth lanthanum ferrate manganate is 0.11 or more and 0.67 or less.

15. The piezoelectric element according to claim 13, wherein the compound oxide has a composition ratio represented by $(1-x)\{(Bi_{1-a},La_a)(Fe_{1-b},Mn_b)O_3\}-x\{BaTiO_3\}$, wherein $0.09 \leq x \leq 0.29$, $0.10 \leq a \leq 0.39$, and $0.01 \leq b \leq 0.09$.

16. The piezoelectric element according to claim 15, wherein $x \approx 0.17$.

17. The piezoelectric element according to claim 15, wherein $0.10 \leq a \leq 0.29$.

18. The piezoelectric element according to claim 13, wherein the bismuth lanthanum ferrate manganate has a composition ratio represented by $(Bi_{1-m},La_m)(Fe_{1-n},Mn_n)O_3$, wherein $0.10 \leq m \leq 0.38$, and $0.01 \leq n \leq 0.09$.

19. A piezoelectric material, comprising a compound oxide having a perovskite structure and comprising bismuth lanthanum ferrate manganate and barium titanate, wherein a molar ratio of the barium titanate to the total amount of the bismuth lanthanum ferrate manganate and the barium titanate is 0.09 or more and 0.29 or less.

20. The piezoelectric material according to claim 19, wherein a molar ratio of lanthanum to bismuth in the bismuth lanthanum ferrate manganate is 0.11 or more and 0.67 or less.

21. The piezoelectric material according to claim 19, wherein the compound oxide has a composition ratio represented by $(1-x)\{(Bi_{1-a},La_a)(Fe_{1-b},Mn_b)O_3\}-x\{BaTiO_3\}$, wherein $0.09 \leq x \leq 0.29$, $0.10 \leq a \leq 0.39$, and $0.01 \leq b \leq 0.09$.

22. The piezoelectric material according to claim 21, wherein $x \approx 0.17$.

23. The piezoelectric material according to claim 21, wherein $0.10 \leq a \leq 0.29$.

24. The piezoelectric material according to claim 19, wherein the bismuth lanthanum ferrate manganate has a composition ratio represented by $(Bi_{1-m},La_m)(Fe_{1-n},Mn_n)O_3$, wherein $0.10 \leq m \leq 0.38$, and $0.01 \leq n \leq 0.09$.

* * * * *